(12) United States Patent
Sun (10) Patent No.: US 11,678,503 B2
(45) Date of Patent: Jun. 13, 2023

(54) ORGANIC LIGHT EMITTING DIODE DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Jiajia Sun, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 489 days.

(21) Appl. No.: 16/641,626

(22) PCT Filed: Jan. 9, 2020

(86) PCT No.: PCT/CN2020/071085
§ 371 (c)(1),
(2) Date: Feb. 24, 2020

(87) PCT Pub. No.: WO2021/047133
PCT Pub. Date: Mar. 18, 2021

(65) Prior Publication Data
US 2021/0408461 A1    Dec. 30, 2021

(30) Foreign Application Priority Data
Sep. 12, 2019  (CN) .................. 201910862724.X (51) Int. Cl.
*H01L 51/52*    (2006.01)
*H01L 51/56*    (2006.01)

(52) U.S. Cl.
CPC .......... *H01L 51/5253* (2013.01); *H01L 51/56* (2013.01)

(58) Field of Classification Search
None
See application file for complete search history.

(56) References Cited

U.S. PATENT DOCUMENTS
2019/0252641 A1    8/2019    Zhang et al.

FOREIGN PATENT DOCUMENTS
CN    107394059 A    11/2017
CN    109004104 A    12/2018
(Continued)

OTHER PUBLICATIONS
Translation of CN109300956, Zhang et al, May 14, 2021, pp. 1-18.*

*Primary Examiner* — Michelle Mandala
(74) *Attorney, Agent, or Firm* — PV IP PC; Wei Te Chung; Zhigang Ma (57) ABSTRACT

An organic light emitting diode display panel of the present disclosure includes a substrate, an array layer disposed on the substrate, a specific recess disposed on a surface of the array layer away from the substrate, an electroluminescent layer disposed on the array layer, and a thin film encapsulation layer disposed on the electroluminescent layer and covering the electroluminescent layer. The thin film encapsulation layer extends into the specific recess and fills the specific recess, and special structures which engage with each other are formed at a position corresponding to the specific recess.

14 Claims, 5 Drawing Sheets

(56) References Cited

FOREIGN PATENT DOCUMENTS

| | | | | |
|---|---|---|---|---|
| CN | 109256481 A | | 1/2019 | |
| CN | 109449306 A | | 3/2019 | |
| CN | 109904341 A | | 6/2019 | |
| CN | 109300956 B | * | 5/2021 | ......... H01L 27/3246 |
| JP | 2006202650 A | | 8/2006 | |

* cited by examiner

ORGANIC LIGHT EMITTING DIODE DISPLAY PANEL AND MANUFACTURING METHOD THEREOF

CROSS REFERENCE TO RELATED APPLICATIONS

This application claims the priority of a Chinese Patent Application No. 201910862724.X, filed on Sep. 12, 2019, titled "ORGANIC LIGHT EMITTING DIODE DISPLAY PANEL", the entire contents of which are incorporated herein by reference.

FIELD OF DISCLOSURE

The present disclosure relates to the field of displays, and in particular to an organic light emitting diode display panel and a manufacturing method thereof.

BACKGROUND

At present, organic light emitting diode devices have advantages such as light weight, wide viewing angles, fast response times, low temperature resistance, and high luminous efficiency compared to traditional liquid crystal displays. Therefore, they have been regarded as a next-generation new display technology in a display industry.

In recent years, an organic light emitting diode device mainly includes a substrate, an array layer, an electroluminescent layer, and a thin film encapsulation layer. The thin film encapsulation layer usually adopts a structure in which inorganic film layer/organic film layer/inorganic film layer disposed one on another. The inorganic film layer functions as a barrier layer for preventing moisture and oxygen. The organic film layer serves as a buffer layer to release an internal stress of the inorganic film layer to enhance a flexibility of the organic light emitting diode device. With a development of an organic light emitting diode industry, dynamic bending has become a research hotspot. However, since a plurality of film layers inside the organic light emitting diode device are not formed at the same time, interfaces between the film layers are not close enough. As an increase of a number of times the organic light emitting diode device is bent, the film layers are easily separated from each other at the interfaces, especially interfaces between the thin film encapsulation layer and the array layer. If these interfaces are separated from each other, external moisture and oxygen will permeate into the electroluminescent segment film, which will seriously affect a luminous performance and a lifespan of an electroluminescent material.

Therefore, how to effectively prevent the array layer film and the thin film encapsulation layer are separated from each other during a bending process of the organic light emitting diode display panel is a difficult problem that panel manufacturers worldwide are trying to overcome.

SUMMARY OF DISCLOSURE

The present disclosure provides an organic light emitting diode display panel and a manufacturing method thereof, which can solve a technical problem that an array layer and a thin film encapsulation layer are separated from each other during a bending process of an existing organic light emitting diode display panel.

The present disclosure provides an organic light emitting diode display panel and a manufacturing method thereof, which can solve a technical problem that an array layer and a thin film encapsulation layer are separated from each other during a bending process of an existing organic light emitting diode display panel.

The present disclosure provides an organic light emitting diode display panel, including a substrate, an array layer, an electroluminescent layer, and a thin film encapsulation layer.

The array layer is disposed on the substrate. The array layer includes a display area and a non-display area surrounding the display area, a plurality of specific recesses are formed on a surface of the array layer away from the substrate, and the specific recesses are disposed on the non-display area.

The electroluminescent layer is disposed on the array layer.

The thin film encapsulation layer is disposed on the electroluminescent layer and covers the electroluminescent layer. The thin film encapsulation layer extends into the specific recesses and fills the specific recesses, a diameter of one of the specific recesses gradually decreases along a direction from the substrate to the thin film encapsulation layer, and special structures which engage with each other are formed at a position corresponding to the specific recesses.

In the organic light emitting diode display panel of the present disclosure, the array layer includes an array sublayer and a first inorganic film layer that are sequentially disposed on the substrate, and the specific recesses are formed on a surface of the first inorganic film layer away from the substrate.

The thin film encapsulation layer includes a second inorganic film layer, an organic film layer, and a third inorganic film layer that are sequentially disposed on the electroluminescent layer, and the third inorganic film layer extends into the specific recesses and fills the specific recesses, and the special structures which engage with each other are formed at the position corresponding to the specific recesses.

In the organic light emitting diode display panel of the present disclosure, the non-display area includes a first side, a second side opposite to the first side, a third side, and a fourth side opposite to the third side.

At least one specific recess is formed on the first side, at least one specific recess is formed on the second side, at least one specific recess is formed on the third side, and at least one specific recess is formed on the fourth side.

In the organic light emitting diode display panel of the present disclosure, the specific recesses are arranged in a regular matrix in the non-display area.

In the organic light emitting diode display panel of the present disclosure, distances between each two adjacent specific recesses are the same, and numbers of the specific recesses arranged in each row are the same, and numbers of the specific recesses arranged in each column are the same.

In the organic light emitting diode display panel of the present disclosure, the specific recesses are arranged in an irregular matrix in the non-display area.

In the organic light emitting diode display panel of the present disclosure, distances between each two adjacent specific recesses are different, and numbers of the specific recesses arranged in different rows are different, and numbers of the specific recesses arranged in different columns are different.

In the organic light emitting diode display panel of the present disclosure, special structures include the specific recesses and a plurality of specific protrusions.

The specific recesses are disposed on the surface of the array layer away from the substrate.

The plurality of specific protrusions are disposed on a surface of the thin film encapsulation layer near the substrate. The specific protrusions are arranged in one-to-one correspondence with the specific recesses, a shape of the specific protrusion matches a shape of the specific recess, and the specific protrusions fill the specific recesses such that the special structures which engage with each other are formed.

The present disclosure also provides an organic light emitting diode display panel, including a substrate, an array layer, an electroluminescent layer, and a thin film encapsulation layer.

The array layer is disposed on the substrate. A plurality of specific recesses are formed on a surface of the array layer away from the substrate.

The electroluminescent layer is disposed on the array layer.

The thin film encapsulation layer is disposed on the electroluminescent layer and covers the electroluminescent layer. The thin film encapsulation layer extends into the specific recesses and fills the specific recesses, and special structures which engage with each other are formed at a position corresponding to the specific recesses.

In the organic light emitting diode display panel of the present disclosure, the array layer includes an array sublayer and a first inorganic film layer that are sequentially disposed on the substrate, and the specific recesses are formed on a surface of the first inorganic film layer away from the substrate.

The thin film encapsulation layer includes a second inorganic film layer, an organic film layer, and a third inorganic film layer that are sequentially disposed on the electroluminescent layer, and the third inorganic film layer extends into the specific recesses and fills the specific recesses, and the special structures which engage with each other are formed at the position corresponding to the specific recesses.

In the organic light emitting diode display panel of the present disclosure, the array layer includes a display area and a non-display area surrounding the display area, and the specific recesses are disposed on the non-display area.

In the organic light emitting diode display panel of the present disclosure, the non-display area includes a first side, a second side opposite to the first side, a third side, and a fourth side opposite to the third side.

At least one specific recess is formed on the first side, at least one specific recess is formed on the second side, at least one specific recess is formed on the third side, and at least one specific recess is formed on the fourth side.

In the organic light emitting diode display panel of the present disclosure, the specific recesses are arranged in a regular matrix in the non-display area.

In the organic light emitting diode display panel of the present disclosure, distances between each two adjacent specific recesses are the same, and numbers of the specific recesses arranged in each row are the same, and numbers of the specific recesses arranged in each column are the same.

In the organic light emitting diode display panel of the present disclosure, the specific recesses are arranged in an irregular matrix in the non-display area.

In the organic light emitting diode display panel of the present disclosure, distances between each two adjacent specific recesses are different, and numbers of the specific recesses arranged in different rows are different, and numbers of the specific recesses arranged in different columns are different.

In the organic light emitting diode display panel of the present disclosure, special structures include the specific recesses and a plurality of specific protrusions.

The specific recesses are disposed on the surface of the array layer away from the substrate.

The plurality of specific protrusions are disposed on a surface of the thin film encapsulation layer near the substrate. The specific protrusions are arranged in one-to-one correspondence with the specific recesses, a shape of the specific protrusion matches a shape of the specific recess, and the specific protrusions fill the specific recesses such that the special structures which engage with each other are formed.

In the organic light emitting diode display panel of the present disclosure, a diameter of one of the specific recesses gradually decreases along a direction from the substrate to the thin film encapsulation layer.

The present disclosure also provides a manufacturing method of an organic light emitting diode display panel, including:

providing a substrate and forming an array layer on the substrate;

forming a regular recess on a surface of the array layer away from the substrate;

changing a shape of the regular recess to form a specific recess;

sequentially forming an electroluminescent layer and a thin film encapsulation layer on the array layer; and filling the specific recess with the thin film encapsulation layer to form special structures which engage with each other.

In the organic light emitting diode display panel and the manufacturing method thereof provided by the present disclosure, the specific recesses are formed on the surface of the array layer away from the substrate, and the thin film encapsulation layer fills the specific recesses during encapsulation, so that special structures which engage with each other are formed at a position corresponding to the specific recesses. Thus, a strong physical interaction is formed between the array layer and the thin film encapsulation layer. During a bending process of the organic light emitting diode display panel, the special structures makes the array layer and thin film encapsulation layer difficult to separate from each other. As a result, external moisture and oxygen are difficult to penetrate into the electroluminescent layer, thereby increasing a lifespan of the organic light emitting diode display panel.

BRIEF DESCRIPTION OF DRAWINGS

In order to explain technical solutions in embodiments of the present disclosure more clearly, drawings used in the description of the embodiments will be briefly introduced below. Apparently, the drawings in the following description are just some embodiments of the present disclosure. For those skilled in the art, other drawings can be obtained based on these drawings without creative efforts.

DETAILED DESCRIPTION

In the following, with reference to accompanying drawings of embodiments of the present disclosure, technical solutions in the embodiments of the present disclosure will be clearly and completely described. Apparently, the embodiments of the present disclosure described below only are a part of embodiments of the present disclosure, but not all embodiments. Based on the described embodiments of the present disclosure, all other embodiments obtained by ordinary skill in the art without creative effort belong to the scope of protection of the present disclosure.

Figure 1:
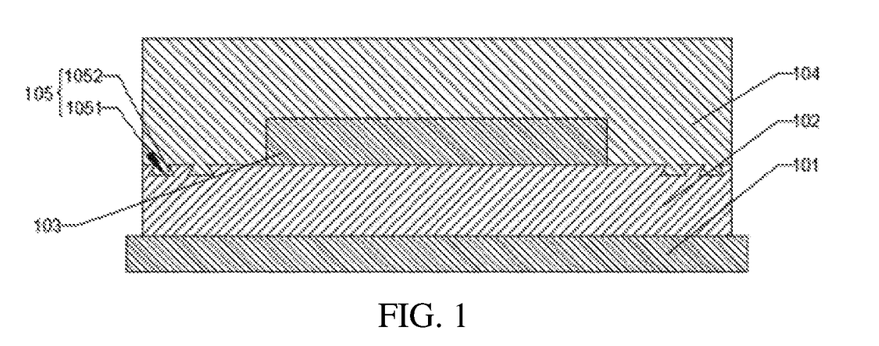
FIG. 1 is a schematic diagram of an organic light emitting diode display panel of an embodiment of the present disclosure.

Please refer to FIG. 1, which is a schematic diagram of an organic light emitting diode display panel of an embodiment of the present disclosure. As shown in FIG. 1, the organic light emitting diode display panel of the embodiment of the present disclosure includes a substrate 101, an array layer 102 disposed on the substrate 101, an electroluminescent layer 103 disposed on the array layer 102, and a thin film encapsulation layer 104 disposed on the electroluminescent layer 103 and covering the electroluminescent layer 103. A plurality of specific recesses 1051 are formed on a surface of the array layer away 102 from the substrate. The thin film encapsulation layer 104 extends into the specific recesses 1051 and fills the specific recesses 1051, and special structures 105 which engage with each other are formed at a position corresponding to the specific recesses 1051.

It can be understood that the special structures 105 are structures which engage with each other. Therefore, there will be a strong physical interaction between the film layers at the special structures 105. During a bending process of the organic light emitting diode display panel, due to the film layers engage with each other, the two film layers are not easily separated from each other, thereby improving a lifespan of the organic light emitting diode display panel.

Figure 2:
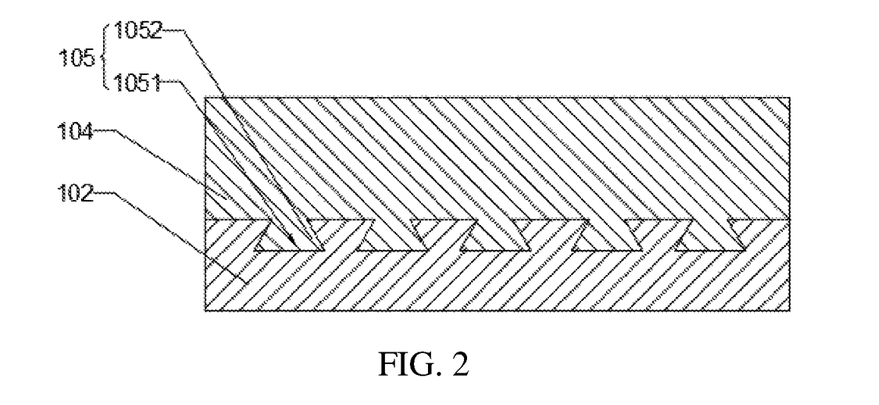
FIG. 2 is a schematic diagram of special structures of the embodiment of the present disclosure.

In one embodiment, please refer to FIG. 2 which is a schematic diagram of special structures of the embodiment of the present disclosure. The special structures 105 include the specific recesses 1051 and a plurality of specific protrusions 1052. The specific recesses 1051 are disposed on the surface of the array layer 102 away from the substrate 101. The specific protrusions 1052 are disposed on a surface of the thin film encapsulation layer 104 near the substrate 101. The specific protrusions 1052 are arranged in one-to-one correspondence with the specific recesses 1051. A shape of the specific protrusion 1052 matches a shape of the specific recess 1051, and the specific protrusions 1052 fill the specific recesses 1051 such that the special structures 105 which engage with each other are formed.

It can be understood that the shape of the specific protrusion 1052 matches the shape of the specific recess 1051, and the specific protrusions 1052 are arranged in one-to-one correspondence with the specific recesses 1051 such that the special structures 105 which engage with each other are formed. Therefore, during the bending process of the organic light emitting diode display panel, the specific recesses 1051 and the specific protrusions 1052 will engage with each other to form a great physical force. The specific recesses 1051 and the specific protrusions 1052 are subjected to the bending force without being separated apart from each other, the film layer where the specific recesses 1051 is located and the film layer where the specific protrusions 1052 is located are not separated from each other, thereby improving the lifespan of the organic light emitting diode display panel.

In one embodiment, a diameter of the specific recess 1051 gradually decreases along a direction from the substrate 101 to the thin film encapsulation layer 104.

It can be understood that a shape of a cross section of the specific recess 1051 is approximately an isosceles trapezoid. A bottom of the cross section of the specific recess 1051 is equivalent to a bottom of the isosceles trapezoid, which can be linear or arc.

Figure 3:
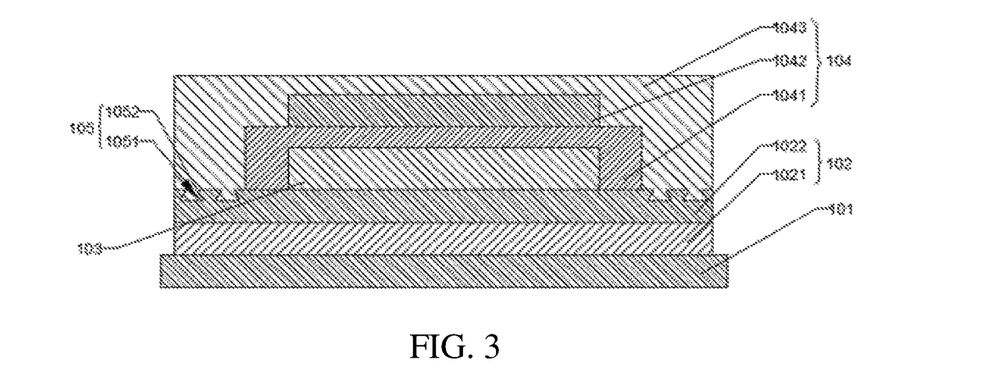
FIG. 3 is a schematic diagram of an organic light emitting diode display panel of another embodiment of the present disclosure.

Furthermore, please refer to FIG. 3, which is a schematic diagram of an organic light emitting diode display panel of another embodiment of the present disclosure. Differences between the organic light emitting diode display panel shown in FIG. 3 and the organic light emitting diode display panel shown in FIG. 1 are as follows. An array layer 102 includes an array sub-layer 1021 and a first inorganic film layer 1022 that are sequentially disposed on the substrate, and specific recesses 1051 are formed on a surface of the first inorganic film layer 1022 away from a substrate 101. A thin film encapsulation layer 104 includes a second inorganic film layer 1041, an organic film layer 1042, and a third inorganic film layer 1043 that are sequentially disposed on an electroluminescent layer 103, and the third inorganic film layer 1043 extends into the specific recesses 1051 and fills the specific recesses 1051, and special structures 105 which engage with each other are formed at the position corresponding to the specific recesses 1051.

It can be understood that a depth of the specific recess 1051 is less than that of the first inorganic film layer 1022. The reason is that if the depth of the special film layer 1051 is greater than the first inorganic film layer 1022, it will cause the third inorganic film layer 1043 cannot completely fill the specific recess 1051 such that the special structures 105 that engage with each other at the specific recess 1051 have a small engaging force. It cannot produce a strong physical effect to against the bending force generated when the organic light emitting diode display panel is bent, thereby causing the first inorganic film layer 1022 and the third inorganic film layer 1043 being separated from each other, and the lifespan of the organic light emitting diode display panel.

In one embodiment, the array sub-layer 1021 includes a flexible base layer, a buffer layer, a gate insulating layer, a gate layer, and a source-drain layer that are sequentially disposed on the substrate 101.

Figure 4:
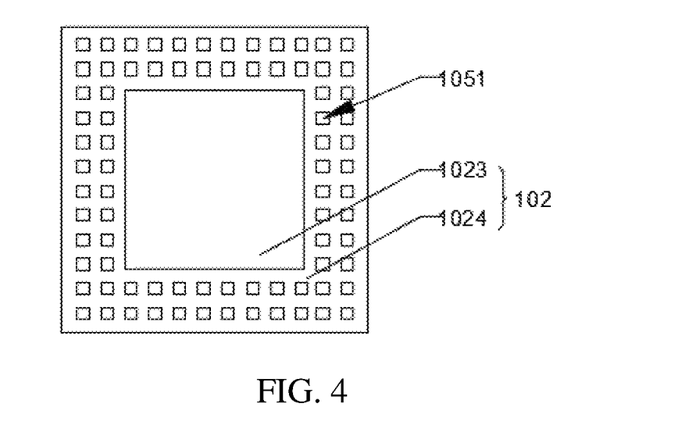
FIG. 4 is a first schematic diagram of an array layer of an organic light emitting diode display panel of an embodiment of the present disclosure.

Please refer to FIG. 4, which is a first schematic diagram of an array layer of an organic light emitting diode display panel of an embodiment of the present disclosure. A shape of specific recesses 1051 on a surface of an array layer 102 is a quadrangle. The array layer 102 includes a display area 1023 and a non-display area 1024 surrounding the display area 1023, and the specific recesses 1051 are disposed on the non-display area 1024. The specific recesses 1051 are arranged in a regular matrix in the non-display area 1024. The non-display area 1024 includes a first side, a second side opposite to the first side, a third side, and a fourth side opposite to the third side. At least one specific recess 1051 is formed on the first side, at least one specific recess 1051 is formed on the second side, at least one specific recess 1051 is formed on the third side, and at least one specific recess 1051 is formed on the fourth side.

Specifically, the shape of the specific recesses 1051 on the surface of the array layer 102 is rectangular. By adopting a rectangular configuration, an engaging force of the special structures 105 can be improved, thereby increasing a physical force between the array layer 102 and the thin film encapsulation layer 104, and preventing the array layer 102 and the thin film encapsulation layer 104 are separated from each other.

Specifically, distances between each two adjacent specific recesses 1051 are the same, and numbers of the specific recesses 1051 arranged in each row are the same, and numbers of the specific recesses 1051 arranged in each column are the same. This is to prevent the distribution of the specific recesses 1051 from being too sparse in some areas, so that during the bending process of the organic light emitting diode, there is not enough physical force between the array layer 102 and the thin film encapsulation layer 104 layer in some areas to release the bending force. As a result, the array layer 102 and the thin film encapsulation layer are separated from each other in some areas, thereby affecting the lifespan of the organic light emitting diode display panel.

Specifically, numbers of specific recesses 1051 disposed on the first side, the second side, the third side, and the fourth side are determined by sizes of the first side, the second side, the third side, and the fourth side of the non-display area 1024 to reach a maximum engaging force of the special structures 105. Therefore, a maximum physical force is achieved between the array layer 102 and the thin film encapsulation layer 104, thereby preventing the array layer 102 and the thin film encapsulation layer 104 being separated from each other, and improving the lifespan of the organic light emitting diode display panel.

Figure 5:
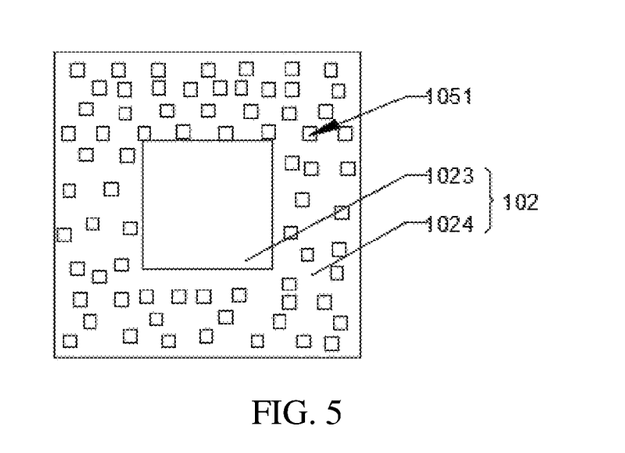
FIG. 5 is a second schematic diagram of an array layer of an organic light emitting diode display panel of an embodiment of the present disclosure.

Furthermore, please refer to FIG. 5, which is a second schematic diagram of an array layer of an organic light emitting diode display panel of an embodiment of the present disclosure. A difference between the second structure diagram of the array layer of the organic light emitting diode display panel shown in FIG. 5 and the first structure diagram of the array layer of the organic light emitting diode display panel shown in FIG. 4 is that specific recesses 1051 are arranged in an irregular matrix in a non-display area 1024.

Specifically, distances between each two adjacent specific recesses 1051 are different, and numbers of the specific recesses 1051 arranged in different rows are different, and numbers of the specific recesses 1051 arranged in different columns are different.

In one embodiment, in a case of the distances between each two adjacent specific recesses 1051 being different, and the numbers of the specific recesses 1051 arranged in each row being the same, and the numbers of the specific recesses 1051 arranged in each column being the same, it is also a way for the specific recesses 1051 to be arranged in the irregular matrix in the non-display area 1024.

In one embodiment, in a case of the distances between each two adjacent specific recesses 1051 being the same, and the numbers of the specific recesses 1051 arranged in different rows being different, and the numbers of the specific recesses 1051 arranged in different columns being different, it is also a way for the specific recesses 1051 to be arranged in the irregular matrix in the non-display area 1024.

Figure 6:
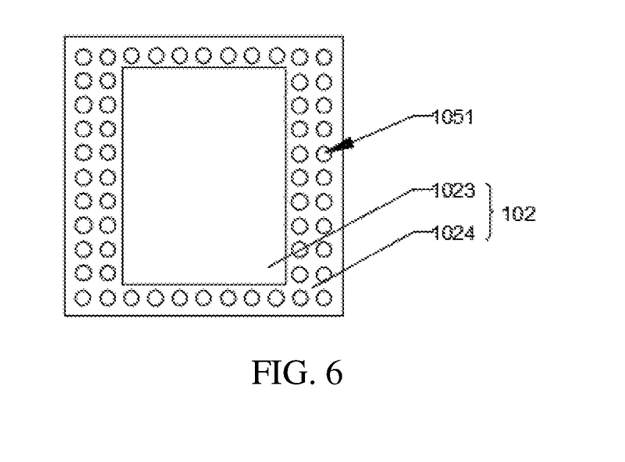
FIG. 6 is a third schematic diagram of an array layer of an organic light emitting diode display panel of an embodiment of the present disclosure.

Furthermore, please refer to FIG. 6, which is a third schematic diagram of an array layer of an organic light emitting diode display panel of an embodiment of the present disclosure. A difference between the third structure diagram of the array layer of the organic light emitting diode display panel shown in FIG. 6 and the first structure diagram of the array layer of the organic light emitting diode display panel shown in FIG. 4 is that a shape of the specific recesses 1051 on a surface of an array layer 102 is circular.

Specifically, the shape of the specific recesses 1051 on the surface of the array layer 102 is round or quadrangular depending on the specific situations.

In one embodiment, the shape of the specific recesses 1051 on the surface of the array layer 102 includes one or more combinations of a circle, a polygon, an arc, and a multi-arc.

In the organic light emitting diode display panel provided by the present disclosure, the specific recesses are formed on the surface of the array layer away from the substrate, and the thin film encapsulation layer fills the specific recesses during encapsulation, so that special structures which engage with each other are formed at a position corresponding to the specific recesses. Thus, a strong physical interaction is formed between the array layer and the thin film encapsulation layer. During a bending process of the organic light emitting diode display panel, the special structures makes the array layer and thin film encapsulation layer difficult to separate from each other. As a result, external moisture and oxygen are difficult to penetrate into the electroluminescent layer, thereby increasing a lifespan of the organic light emitting diode display panel.

Figure 7:
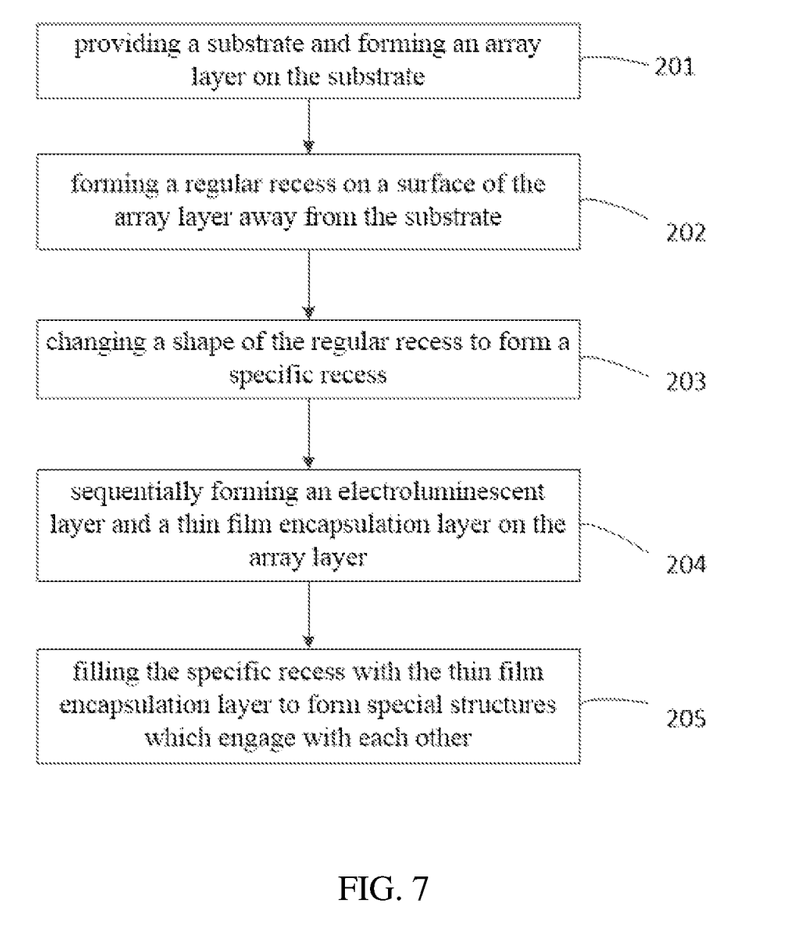
FIG. 7 is a flowchart of a manufacturing method of an organic light emitting diode display panel of an embodiment of the present disclosure.

Please refer to FIG. 7 which is a flowchart of a manufacturing method of an organic light emitting diode display panel of an embodiment of the present disclosure. As shown in FIG. 7, the manufacturing method includes the following steps. In a step 201, a substrate is provided, and an array layer is formed on the substrate. In a step 202, a regular recess is formed on a surface of the array layer away from the substrate. In a step 203, a shape of the regular recess is changed to form a specific recess. In a step 204, an electroluminescent layer and a thin film encapsulation layer are sequentially formed on the array layer. In a step 205, the specific recess is filled with the thin film encapsulation layer to form special structures which engage with each other.

In one embodiment, the step 202 specifically includes the following. A dry etching technique is used to form the regular recess on a surface of a last inorganic film layer of the array layer away from the substrate. The dry etching technique includes one or more combinations of ion bombardment and chemical reaction.

Figure 8:
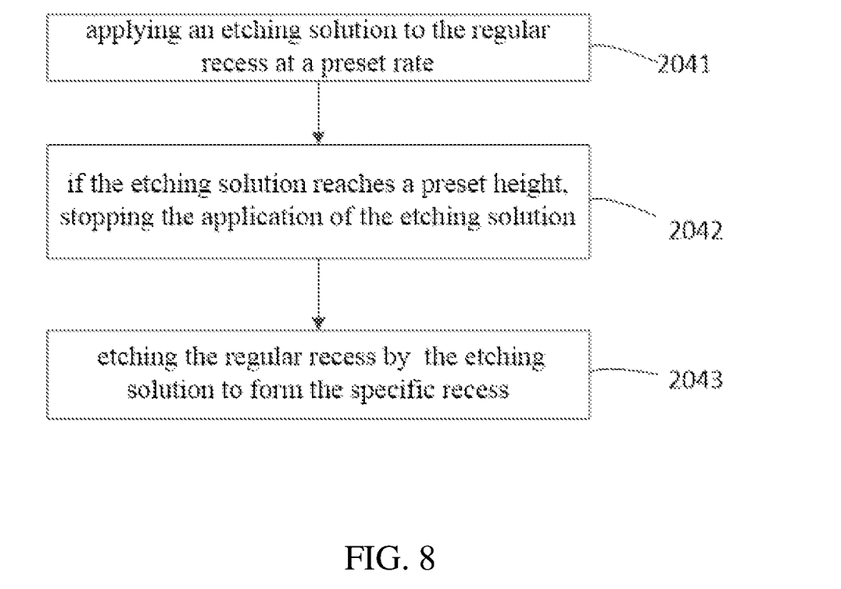
FIG. 8 is a sub-flowchart of the manufacturing method of the organic light emitting diode display panel of the embodiment of the present disclosure.

Specifically, please refer to FIG. 7 and FIG. 8. FIG. 8 is a sub-flowchart of the manufacturing method of the organic light emitting diode display panel of the embodiment of the present disclosure. With reference to FIG. 7 and FIG. 8, the step 204 specifically includes the following steps. In a step 2041, an etching solution is applied to the regular recess at a preset rate. In a step 2042, if the etching solution reaches a preset height, the application of the etching solution is stopped. In a step 2043, the etching solution etches the regular recess to form the specific recess.

It can be understood that the preset rate is a fixed value, and a height of the etching solution in the recess gradually increases with time through the preset rate, so that an etching time on two sides of a bottom of the recess is the longest, and an etching time on two sides of a bottom of the recess is the shortest. Thus, the specific recess required for the present disclosure is formed. The preset height reached by the etching solution is determined by a concentration, a kind of the etching solution, and a size of the regular recess.

For the specific structure of the organic light emitting diode display panel provided by the present disclosure, reference may be made to the foregoing embodiments, and details are not described herein again.

It can be understood that the organic light emitting diode display panel prepared by the manufacturing method, the specific recess is formed on the surface of the array layer away from the substrate, and the thin film encapsulation layer fills the specific recess during encapsulation, so that special structures which engage with each other are formed at a position corresponding to the specific recess. Thus, a strong physical interaction is formed between the array layer and the thin film encapsulation layer. During a bending process of the organic light emitting diode display panel, the special structures makes the array layer and thin film encapsulation layer difficult to separate from each other. As a result, external moisture and oxygen are difficult to penetrate into the electroluminescent layer, thereby increasing a lifespan of the organic light emitting diode display panel.

Preferred embodiments of the present invention are described above. Several particular examples are illustrated herein to explain the principle and embodiments of the present disclosure. The description of the above embodiments is provided only to help understand the present invention. Also, many modifications can be made to the particular embodiments and applicable areas by those skilled in the art according the ideas of the present disclosure. In summary, the content of the description should not be construed as limiting the present disclosure.

What is claimed is:

1. An organic light emitting diode display panel, comprising:
    a substrate;
    an array layer disposed on the substrate, wherein the array layer comprises a display area and a non-display area surrounding the display area, a plurality of specific recesses are formed on a surface of the array layer away from the substrate, and the specific recesses are separated from each other and are arranged in a matrix of rows and columns in the non-display area;
    an electroluminescent layer disposed on the array layer; and
    a thin film encapsulation layer disposed on the electroluminescent layer and covering the electroluminescent layer, wherein the thin film encapsulation layer extends into the specific recesses and fills the specific recesses, a diameter of one of the specific recesses gradually decreases along a direction from the substrate to the thin film encapsulation layer, and special structures which engage with each other are formed at a position corresponding to the specific recesses.

2. The organic light emitting diode display panel as claimed in claim 1, wherein the array layer comprises an array sub-layer and a first inorganic film layer that are sequentially disposed on the substrate, and the specific recesses are formed on a surface of the first inorganic film layer away from the substrate; and
    the thin film encapsulation layer comprises a second inorganic film layer, an organic film layer, and a third inorganic film layer that are sequentially disposed on the electroluminescent layer, and the third inorganic film layer extends into the specific recesses and fills the specific recesses, and the special structures which engage with each other are formed at the position corresponding to the specific recesses.

3. The organic light emitting diode display panel as claimed in claim 1, wherein the non-display area comprises a first side, a second side opposite to the first side, a third side, and a fourth side opposite to the third side; and
    at least one specific recess is formed on the first side, at least one specific recess is formed on the second side, at least one specific recess is formed on the third side, and at least one specific recess is formed on the fourth side.

4. The organic light emitting diode display panel as claimed in claim 1, wherein the specific recesses are arranged in a regular matrix in the non-display area.

5. The organic light emitting diode display panel as claimed in claim 4, wherein distances between each two adjacent specific recesses are the same, and numbers of the specific recesses arranged in each row are the same, and numbers of the specific recesses arranged in each column are the same.

6. The organic light emitting diode display panel as claimed in claim 1, wherein the specific recesses are arranged in an irregular matrix in the non-display area.

7. The organic light emitting diode display panel as claimed in claim 6, wherein distances between each two adjacent specific recesses are different, and numbers of the specific recesses arranged in different rows are different, and numbers of the specific recesses arranged in different columns are different.

8. The organic light emitting diode display panel as claimed in claim 1, wherein special structures comprise:
    the specific recesses disposed on the surface of the array layer away from the substrate; and
    a plurality of specific protrusions disposed on a surface of the thin film encapsulation layer near the substrate, wherein the specific protrusions are arranged in one-to-one correspondence with the specific recesses, a shape of the specific protrusion matches a shape of the specific recess, and the specific protrusions fill the specific recesses such that the special structures which engage with each other are formed.

9. An organic light emitting diode display panel, comprising:
    a substrate;
    an array layer disposed on the substrate, wherein the array layer comprises a display area and a non-display area surrounding the display area, a plurality of specific recesses are formed on a surface of the array layer away from the substrate, the specific recesses are arranged in an irregular matrix in the non-display area, and the plurality of specific recesses are separated from each other and are arranged in a matrix of rows and columns in the non-display area;
    an electroluminescent layer disposed on the array layer; and
    a thin film encapsulation layer disposed on the electroluminescent layer and covering the electroluminescent layer, wherein the thin film encapsulation layer extends into the specific recesses and fills the specific recesses, and special structures which engage with each other are formed at a position corresponding to the specific recesses.

10. The organic light emitting diode display panel as claimed in claim 9, wherein the array layer comprises an array sub-layer and a first inorganic film layer that are sequentially disposed on the substrate, and the specific recesses are formed on a surface of the first inorganic film layer away from the substrate; and the thin film encapsulation layer comprises a second inorganic film layer, an organic film layer, and a third inorganic film layer that are sequentially disposed on the electroluminescent layer, and the third inorganic film layer extends into the specific recesses and fills the specific recesses, and the special structures which engage with each other are formed at the position corresponding to the specific recesses.

11. The organic light emitting diode display panel as claimed in claim 9, wherein the non-display area comprises a first side, a second side opposite to the first side, a third side, and a fourth side opposite to the third side; and
   at least one specific recess is formed on the first side, at least one specific recess is formed on the second side, at least one specific recess is formed on the third side, and at least one specific recess is formed on the fourth side.

12. The organic light emitting diode display panel as claimed in claim 9, wherein distances between each two adjacent specific recesses are different, and numbers of the specific recesses arranged in different rows are different, and numbers of the specific recesses arranged in different columns are different.

13. The organic light emitting diode display panel as claimed in claim 9, wherein special structures comprise:
   the specific recesses disposed on the surface of the array layer away from the substrate; and
   a plurality of specific protrusions disposed on a surface of the thin film encapsulation layer near the substrate, wherein the specific protrusions are arranged in one-to-one correspondence with the specific recesses, a shape of the specific protrusion matches a shape of the specific recess, and the specific protrusions fill the specific recesses such that the special structures which engage with each other are formed.

14. A manufacturing method of an organic light emitting diode display panel, comprising:
   providing a substrate and forming an array layer on the substrate, wherein the array layer comprises a display area and a non-display area surrounding the display area;
   forming a plurality of regular recesses on a surface of the array layer away from the substrate;
   changing a shape of the regular recess to form a plurality of specific recesses, wherein the specific recesses are arranged in an irregular matrix in the non-display area, and the plurality of specific recesses are separated from each other and are arranged in a matrix of rows and columns in the non-display area;
   sequentially forming an electroluminescent layer and a thin film encapsulation layer on the array layer; and
   filling the specific recess with the thin film encapsulation layer to form special structures which engage with each other.

* * * * *